United States Patent
Taylor et al.

(10) Patent No.: US 8,837,243 B2
(45) Date of Patent: Sep. 16, 2014

(54) DEEPLY PIPELINED INTEGRATED MEMORY BUILT-IN SELF-TEST (BIST) SYSTEM AND METHOD

(75) Inventors: Gary L. Taylor, Windsor, CO (US); Rosalee D. Gunderson, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 380 days.

(21) Appl. No.: 13/408,621

(22) Filed: Feb. 29, 2012

(65) Prior Publication Data

US 2013/0223168 A1 Aug. 29, 2013

(51) Int. Cl.
*G11C 29/16* (2006.01)
*G11C 29/20* (2006.01)

(52) U.S. Cl.
USPC .......................... 365/201; 714/719; 711/218

(58) Field of Classification Search
USPC ............ 365/200, 201; 714/718–723; 711/218
See application file for complete search history.

(56) References Cited

U.S. PATENT DOCUMENTS

| | | | |
|---|---|---|---|
| 6,697,290 B2 | 2/2004 | Koss et al. | |
| 6,829,728 B2 | 12/2004 | Cheng et al. | |
| 6,914,833 B2 | 7/2005 | Koss et al. | |
| 7,055,075 B2 | 5/2006 | Koss et al. | |
| 7,325,178 B2 * | 1/2008 | Damodaran et al. | 714/718 |
| 7,620,869 B2 | 11/2009 | Okabayashi | |
| 7,676,709 B2 * | 3/2010 | Chan | 714/719 |
| 7,949,909 B2 | 5/2011 | Andreev et al. | |
| 8,046,655 B2 | 10/2011 | Dubey | |
| 2009/0094494 A1 * | 4/2009 | Takeshima | 714/719 |
| 2011/0225475 A1 * | 9/2011 | Kumar et al. | 714/763 |
| 2012/0054564 A1 * | 3/2012 | Tiwary et al. | 714/718 |

OTHER PUBLICATIONS

Sheng Chih Shen, et al., "A High Speed BIST Architecture for DDR-SDRAM Testing," Proceedings of the 2005 IEEE International Workshop on Memory Technology, Design and Testing, 2005.

* cited by examiner

*Primary Examiner* — Harry W Byrne
*Assistant Examiner* — Lance Reidlinger

(57) ABSTRACT

A memory system with integrated memory built-in self-test (BIST) circuitry has one or more pipeline registers interposed between combinational logic elements. These combinational logic elements can include write data decoding logic, memory control signal decoding logic, address counter logic, address comparison logic, data comparison logic, and next state decoding logic. Features can be included that compensate for the delay inherent in the pipeline registers.

16 Claims, 5 Drawing Sheets

| CLOCK | CLK_1 | CLK_2 | CLK_3 | CLK_4 | CLK_5 | CLK_6 | CLK_7 | CLK_8 |
|---|---|---|---|---|---|---|---|---|
| STATE | A | A | A | A | A | B | | |
| COUNT | INCR | INCR | INCR | INCR | INCR | HOLD | | |
| NEXT ADDR | N-1 | N | N+1 | N+2 | N+3 | N+3 | | |
| CURRENT ADDR | N-2 | N-1 | N | N+1 | N+2 | N+3 | N+3 | |
| LAST ADDR | N-3 | N-2 | N-1 | N | N+1 | N+2 | N+3 | N+3 |
| AT_MAX | FALSE | FALSE | FALSE | FALSE | FALSE | FALSE | FALSE | FALSE |
| RD ENABLE (REG) | TRUE | TRUE | TRUE | TRUE | TRUE | TRUE | FALSE | FALSE |
| AT_MAX (DELAYED) | FALSE | FALSE | FALSE | FALSE | FALSE | FALSE | FALSE | FALSE |
| MEMORY OUTPUT | TD(N-3) | TD(N-2) | TD(N-1) | TD(N) | TD(N+1) | TD(N+2) | TD(N+3) | NONE |
| OUTPUT DATA REG | TD(N-4) | TD(N-3) | TD(N-2) | TD(N-1) | TD(N) | TD(N+1) | TD(N+2) | TD(N+3) |
| EXPECTED DATA | ED(N-4) | ED(N-3) | ED(N-2) | ED(N-1) | ED(N) | ED(N+1) | ED(N+2) | ED(N+3) |
| PASS-FAIL | PASS | PASS | PASS | PASS | FAIL | PASS | PASS | N/A |
| PASS-FAIL (DELAYED) | PASS | PASS | PASS | PASS | FAIL | FAIL | PASS | N/A |

FIG. 4

| CLOCK | CLK_1 | CLK_2 | CLK_3 | CLK_4 | CLK_5 | CLK_6 |
|---|---|---|---|---|---|---|
| STATE | A | A | A | C | D | E |
| COUNT | INCR | INCR | INCR | INCR | INCR | RESET |
| NEXT ADDR | MAX-1 | MAX | MAX | MAX | MAX | 0 |
| CURRENT ADDR | MAX-2 | MAX-1 | MAX | MAX | MAX | MAX |
| LAST ADDR | N-3 | N-2 | N-1 | N | N+1 | N+2 |
| AT_MAX | FALSE | FALSE | TRUE | TRUE | TRUE | FALSE |
| RD ENABLE (REG) | TRUE | TRUE | TRUE | FALSE | FALSE | FALSE |
| AT_MAX (DELAYED) | FALSE | FALSE | FALSE | TRUE | TRUE | TRUE |
| MEMORY OUTPUT | TD(MAX-3) | TD(MAX-2) | TD(MAX-1) | TD(MAX) | NONE | NONE |
| OUTPUT DATA REG | TD(MAX-4) | TD(MAX-3) | TD(MAX-2) | TD(MAX-1) | TD(MAX) | TD(MAX+1) |
| EXPECTED DATA | ED(N-4) | ED(N-3) | ED(N-2) | ED(N-1) | ED(N) | ED(N+1) |
| PASS-FAIL | PASS | PASS | PASS | PASS | PASS | PASS |
| PASS-FAIL (DELAYED) | PASS | PASS | PASS | PASS | PASS | PASS |

FIG. 5

DEEPLY PIPELINED INTEGRATED MEMORY BUILT-IN SELF-TEST (BIST) SYSTEM AND METHOD

BACKGROUND

Memory systems in an integrated circuit (IC) device may include built-in self-test (BIST) circuitry. The term "built-in" means that the circuitry is fabricated on the same IC chip as the memory array to be tested and forms an integral part of the overall memory system. Such BIST circuitry can be used to test a memory array of a newly manufactured IC device.

As illustrated in FIG. 1, a typical integrated memory system 10 having BIST circuitry includes a memory subsystem 12, sequential control logic 14, write data decoding logic 16, memory control signal decoding logic 18, address counter logic 20, address comparison logic 22, and test data comparison logic 24. The memory array to be tested is internal to memory subsystem 12 and not separately shown in FIG. 1 for purposes of clarity. The BIST circuitry, in accordance with an algorithm, commonly first writes test data to all of the memory locations in the memory array in the sequence of their addresses, and then reads back those memory locations in the same sequence, comparing the data that is read back with expected data. If the data that is read back does not match the expected data, an error condition is flagged.

In normal operation, i.e., when the BIST circuitry is not being used to test the memory array in memory subsystem 12, memory subsystem 12 can perform read operations and write operations in response to data and addresses received from a processor (not shown) or other system external to memory system 10. In response to such an external system initiating a write operation, memory subsystem 12 writes the data that the external device presents at a normal data input 26 to a memory location corresponding to an address that the external system presents at a normal address input 28. In response to such an external system initiating a read operation, memory subsystem 12 reads data from a memory location corresponding to an address that the external device presents at normal address input 28. Although not separately shown in FIG. 1 for purposes of clarity, memory subsystem 12 includes an internal data output register that registers or temporarily stores each data word as it is read from the memory array. In normal operation, i.e., when the BIST circuitry is not being used to test the memory array in memory subsystem 12, the output of this data output register is presented to the data output 30 of memory subsystem 12.

Memory system 10 can be switched or selected to operate in either the normal operational mode described in the preceding paragraph or the BIST mode. A data input multiplexer (not shown) internal to memory subsystem 12 selects normal data input 26 in the normal operational (i.e., non-BIST) mode or a test data input 27 in BIST mode. An address input multiplexer (not shown) internal to memory subsystem 12 selects normal address input 28 in normal operational (i.e., non-BIST) mode or a test address input 29 in BIST mode. When BIST mode is selected, memory system 10 operates as follows.

A clock signal ("CLK") maintains the sequential elements of integrated memory system 10 in synchronization with each other. Sequential control logic 14 is similar to a state machine in that it cycles through a sequence of states. State flip-flops 30 in sequential control logic 14 maintain or store the current state. Next state decoding logic 32 determines the next state in the sequence of states in response to the current state and in response to a pass-fail signal 34 and a maximum address signal 36. As sequential control logic 14 enters the next state in the sequence of states, it outputs state information signals 38. Write data decoding logic 16 decodes some of state information signals 38 to produce expected data and test data. Memory subsystem 12 receives the test data from write data decoding logic 16 on the test data input 27. Memory control signal decoding logic 18 decodes some of state information signals 38 to produce memory control signals 39 generally of the type commonly referred to as enable signals. On each clock cycle, memory control signals 39 indicate whether a write operation is to be performed, a read operation is to be performed, or neither a read nor a write operation is to be performed. Memory subsystem 12 receives test data at test data input 27. Memory subsystem 12 also receives a test address, which can be referred to as the "current address," from address counter logic 20 at test address input 29. Although not separately shown in FIG. 1 for purposes of clarity, the test data and current address are temporarily stored or registered in a data register and an address register, respectively, internal to memory subsystem 12. This address register provides an address, which can be referred to as the "last address," directly to the memory array. The last address, i.e., the contents of the address register, is also provided to address counter logic 20. Address counter logic 20 essentially comprises an adder that, under some conditions, adds one to the last address to produce the current address. Under some conditions, address counter logic 20 may add a number other than one to the last address or may subtract a number from the last address.

Test data comparison logic 24 receives the expected data from write data decoding logic 16. In response to some of state information signals 38, address counter logic 20 generally does one of the following on the next clock cycle, depending on the state: increment the current address by one; hold the current address; and reset the address to zero (or some other base address in the memory address space).

Address comparison logic 22 compares the current address to a maximum address ("MAX_ADDR") that represents the ending address of the sequence of addresses to be tested. Memory locations spanning addresses from the base address to the maximum address are tested. If the current address matches the maximum address, address comparison logic 22 provides a maximum address signal ("AT_MAX") to next state decoding logic 32 of sequential control logic 14. Thus, if sequential control logic 14 determines that the write or read operations have reached the maximum address, sequential control logic 14 can cause the write or read operations to stop by generating state information signals 38 in which a stop or "hold" condition is encoded. Memory control signal decoding logic 18 decodes such state information signals 38 in a manner that adjusts memory control signals 39 to inhibit the memory array from performing a next write or read operation. Thus, when the BIST circuitry is writing test data, the addresses to which the test data values are written are generally incremented by one on each successive clock cycle until the maximum address is reached.

When the BIST circuitry is reading back memory locations, the data read from each memory location is registered in the above-referenced data output register that is internal to memory subsystem 12. In BIST mode, memory subsystem 12 provides the contents of this register at a data output 40. Data comparison logic 24 compares the value read back from a memory location with an expected data value. If the value that is read back matches the expected value, data comparison logic 24 sets the value of a pass-fail signal 42 to indicate that the test of that memory location passed. If the value that is read back does not match the expected value, data comparison logic 24 sets the value of pass-fail signal 42 to indicate that the test of that memory location failed. Although not shown for purposes of clarity, memory system 10 includes additional circuitry that outputs information identifying addresses at which the test failed to an external system (e.g., not on the same IC chip as memory system 10). If sequential control logic 14 determines that such a test failure has occurred, sequential control logic 14 can cause the read operations to stop by generating state information signals 38 in which a "hold" condition is encoded. Memory control signal decoding logic 18 decodes such state information signals 38 in a manner that adjusts memory control signals 39 to inhibit the memory array from performing a next read operation. Thus, when the BIST circuitry is reading test data, the addresses from which the test data values are read are generally incremented by one on each successive clock cycle until either a failure is detected or the maximum address is reached.

It is desirable to test the memory array of memory subsystem 12 at the highest speed possible. However, the speed at which the memory array can be tested is limited by the propagation delays through the combinational logic, including write data decoding logic 16, memory control signal decoding logic 18, address counter logic 20, address comparison logic 22, test data comparison logic 24, and next state decoding logic 32.

SUMMARY

Embodiments of the invention relate to a memory system with integrated memory built-in self-test (BIST) circuitry having one or more pipeline registers interposed between combinational logic elements. In an exemplary embodiment, the memory system includes a memory subsystem, sequential control logic, write data decoding logic, memory control signal decoding logic, address counter logic, address comparison logic, and data comparison logic.

The memory subsystem includes a memory array that the BIST circuitry can test. The memory subsystem is configured to read data from and write data to addresses in the memory array.

The sequential control logic is configured to control testing addresses in the memory array by performing write operations of test data to a sequence of addresses in an address sequence and read operations of output data from the sequence of addresses in the address sequence. The sequential control logic has a plurality of states and outputs state information corresponding to a current state of the plurality of states.

The write data decoding logic is configured to receive at least a portion of the state information from the sequential control logic and generate test data values and expected data values.

The memory control signal decoding logic is configured to receive at least a portion of the state information from the sequential control logic and generate a current memory control signal set in a memory control signal set sequence. The current memory control signal set corresponds to a current address in the address sequence.

The address counter logic is configured to receive at least a portion of the state information from the sequential control logic and generate addresses in the address sequence. The memory subsystem tests memory locations in response to the addresses generated by the address counter logic and the memory control signals generated by the memory control signal decoding logic.

The address comparison logic is configured to receive the current address and compare the current address with a maximum address. The address comparison logic output a maximum address indication when the current address reaches the maximum address.

The data comparison logic is configured to receive data read from a tested memory location in response to a memory address generated by the address counter logic. The data comparison logic is further configured to compare the data read from a tested memory location with an expected data value. If the data read from a tested memory location (address) matches an expected data value, the data comparison logic sets a pass-fail indication to indicate that the test of that address passed. If the data read from a tested memory location does not match the expected value, the data comparison logic sets the pass-fail indication to indicate the test of that address failed.

A least one pipeline register is disposed immediately between a pair of combinational logic elements. The pair of elements can comprise any of the following: the memory control signal decoding logic and the memory subsystem; the address counter logic and the address comparison logic; the address comparison logic and the sequential control logic; the address comparison logic and the address counter logic; the address comparison logic and the memory control signal decoding logic; the data comparison logic and the sequential control logic; the data comparison logic and the address counter logic; and the data comparison logic and the memory control signal decoding logic. The BIST circuitry can be provided with features that compensate for the one clock cycle of delay owed to such a pipeline register.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

FIG. 4 is a first timing diagram, illustrating a first example of operation of the memory system of FIG. 2.

FIG. 5 is a second timing diagram, illustrating a second example of operation of the memory system of FIG. 2.

DETAILED DESCRIPTION

Figure 2:
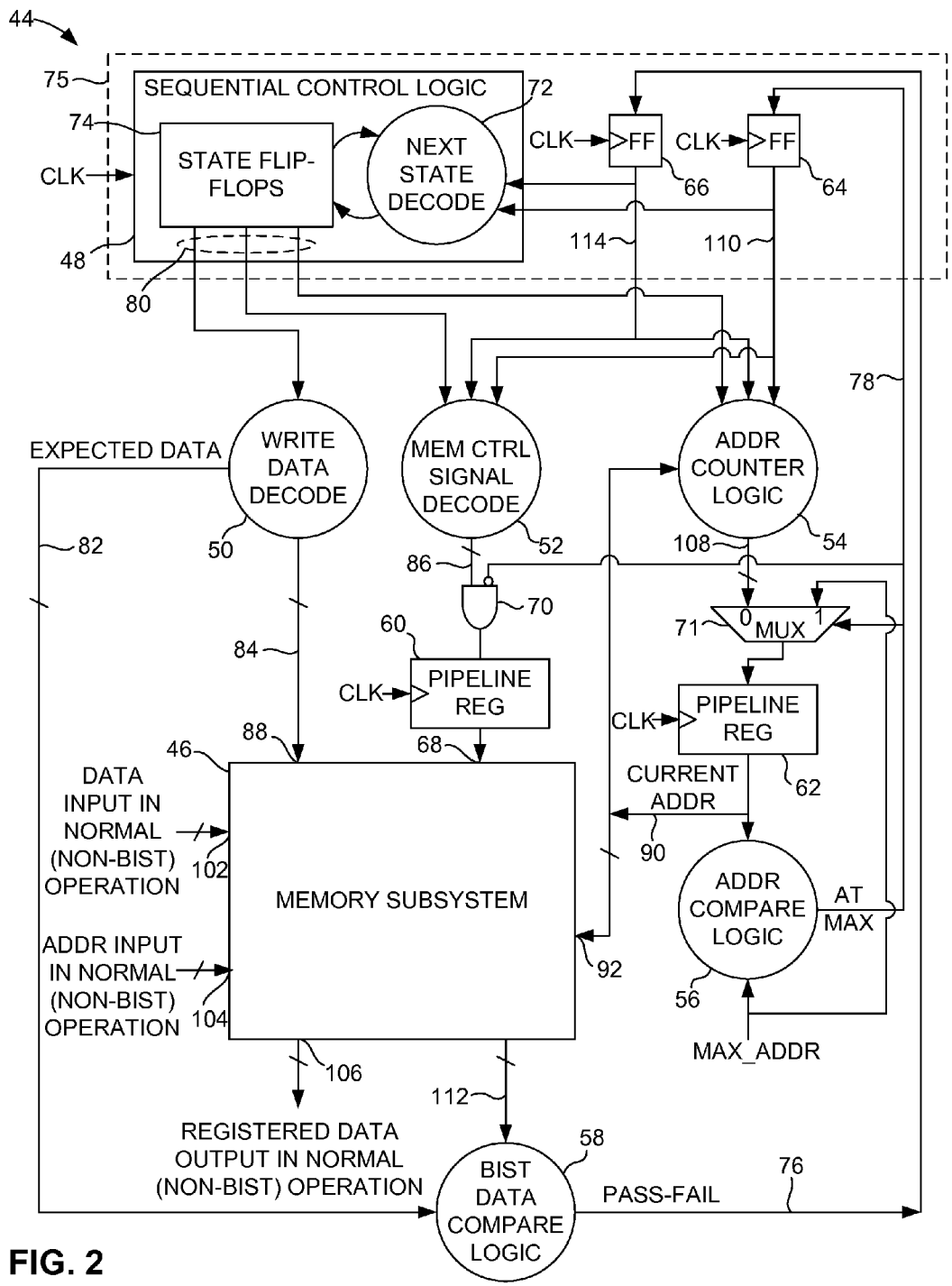
FIG. 2 is a block diagram of a memory system in accordance with an exemplary embodiment of the present invention.

As illustrated in FIG. 2, in an illustrative or exemplary embodiment of the invention, a memory system 44 having a BIST circuitry includes a memory subsystem 46, sequential control logic 48, write data decoding logic 50, memory control signal decoding logic 52, address counter logic 54, address comparison logic 56, and data comparison logic 58. Memory system 44 further includes a first pipeline register 60, a second pipeline register 62, a third pipeline register 64, and a fourth pipeline register 66. It has been discovered in accordance with the present invention that memory subsystem 46 can be tested at a faster clock speed due to the inclusion of one or more of pipeline registers 60-66 than a similar memory subsystem not having such pipeline registers could be tested.

First pipeline register 60 connects the output of memory control signal decoding logic 52 to the control signal input 68 of memory subsystem 46 via an AND gate 70. First pipeline register 60 also connects the output of address comparison logic 56 to control signal input 68 of memory subsystem via AND gate 70. Second pipeline register 62 connects the output of the address counter logic 54 to the current address input of the address comparison logic 56 via a multiplexer 71. Third pipeline register 64, which in this exemplary embodiment comprises a single flip-flop, connects the output of address comparison logic 56 to an input of memory control signal decoding logic 52 and an input of address counter logic 54. Third pipeline register 64 also connects the output of address comparison logic 56 to an input of the next state decoding logic 72 of sequential control logic 48. Fourth pipeline register 66, which in this exemplary embodiment comprises a single flip-flop, connects the output of data comparison logic 58 to an input of memory control signal decoding logic 52 and an input of address counter logic 54. Fourth pipeline register 66 also connects the output of data comparison logic 58 to another input of next state decoding logic 72 of sequential control logic 48.

A clock signal ("CLK") maintains the sequential elements of memory system 44 in synchronization with each other. Sequential control logic 48 is similar to a state machine in that it cycles through a sequence of states. A state machine 75 is defined by the combination of next state decoding logic 72, state flip-flops 74, and pipeline registers 64 and 66. That is, state flip-flops 74 and pipeline registers 64 and 66 together maintain or store the current state. Next state decoding logic 72 determines the next state in the sequence of states in response to the current state and in response to a pass-fail signal 76 ("PASS-FAIL") generated by data comparison logic 58 and a maximum address signal 78 ("AT_MAX") generated by address comparison logic 56.

When memory system 44 is in BIST mode, as sequential control logic 14 enters the next state in the sequence of states, its state flip-flops 74 output state information signals 80. Write data decoding logic 16 decodes some of state information signals 80 to produce expected data 82 and test data 84. Memory control signal decoding logic 52 decodes some of state information signals 38 to produce memory control signals 86 generally of the type commonly referred to as "enable" signals. Memory control signal decoding logic 52 produces a set of one or more memory control signals 86 on each clock cycle. On each clock cycle, the set of memory control signals 86 indicates whether a write operation is to be performed, a read operation is to be performed, or neither a read nor a write operation is to be performed. As described in further detail below, address comparison logic 56 can assert maximum address signal 78 on some clock cycles to inhibit the memory control signals 86 (and thereby inhibit write and read operations) at the input to first pipeline register 60.

Memory subsystem 46 receives test data 84 from write data decoding logic 50 at test data input 88. Memory subsystem 46 also receives a test address, which can be referred to as the "current address" 90 from address counter logic 54 at test address input 92.

Figure 1:
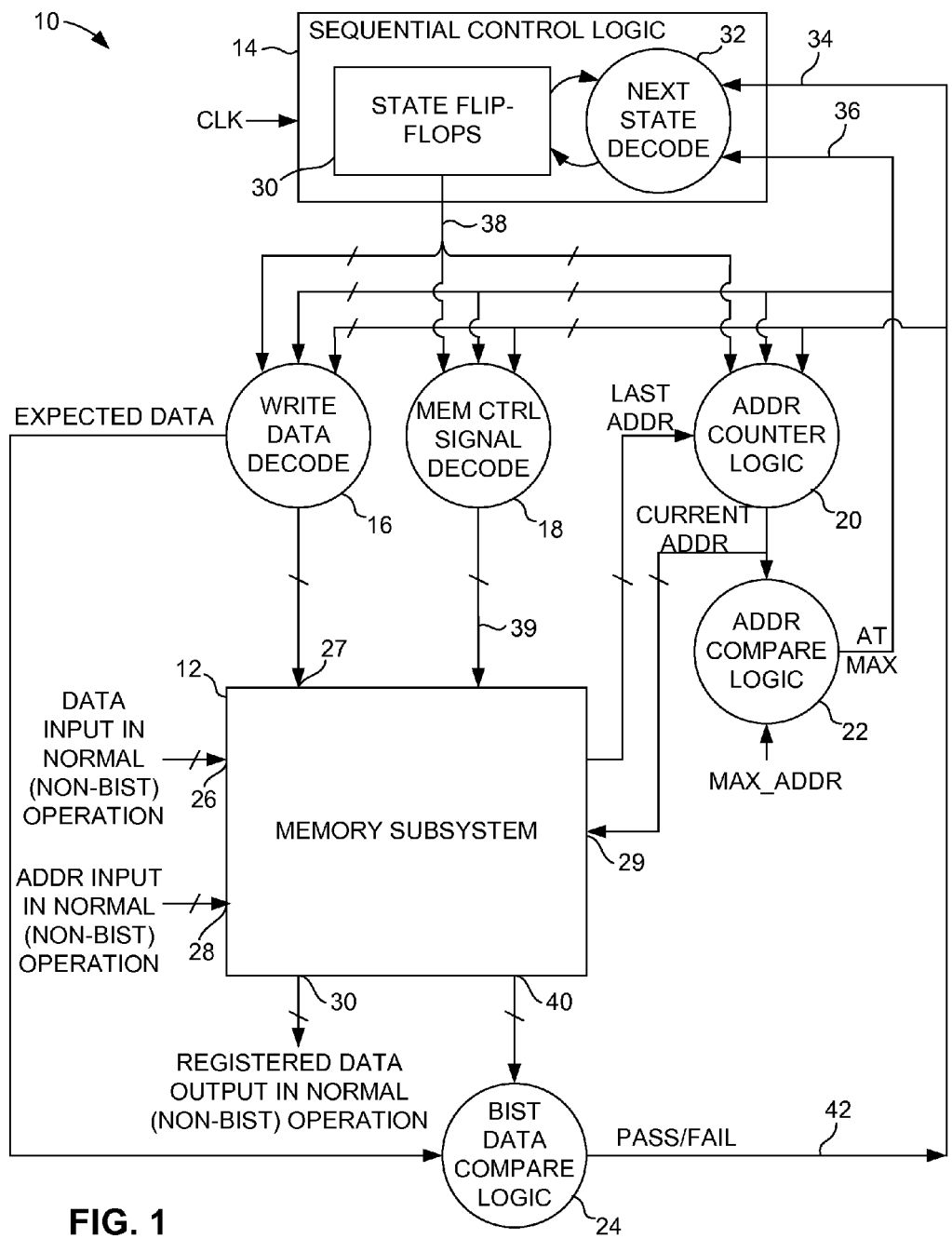
FIG. 1 is block diagram of a memory system in accordance with the prior art.
Figure 3:
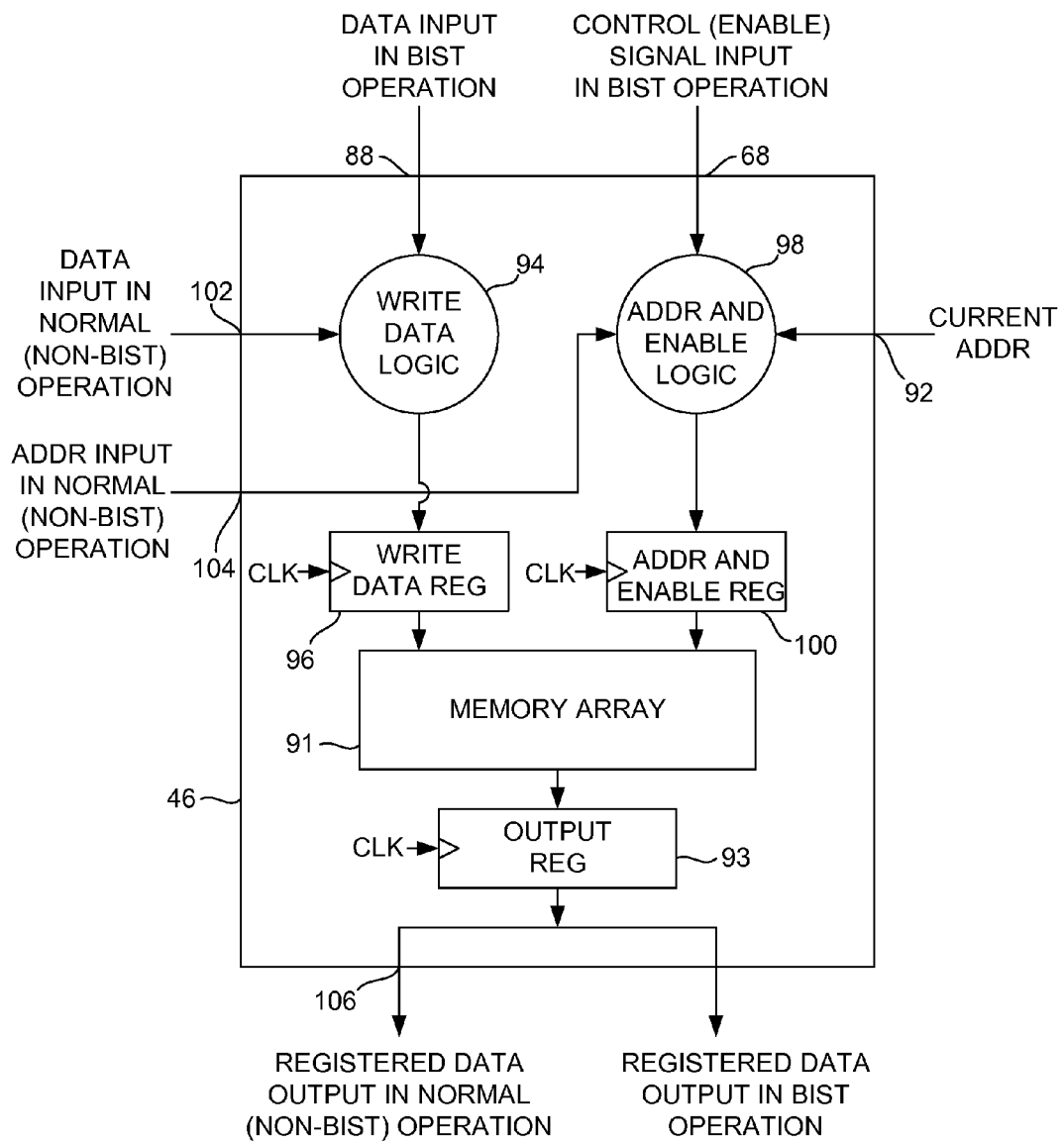
FIG. 3 is a block diagram of the memory subsystem of the memory system of FIG. 2.

As illustrated in FIG. 3, memory subsystem 46 includes a memory array 91, a data output register 93, write data logic 94, a write data register 96, address and enable logic 98, and an address and enable register 100. Memory system 44 (FIG. 1) can be switched or selected to operate in either a normal operational mode or a BIST mode. Write data logic 94 serves as a data input multiplexer to select either a normal data input 102 in the normal operational (i.e., non-BIST) mode or the above-referenced test data input 88 in BIST mode. Address and enable logic 98 similarly serves as an address input multiplexer to select either a normal address input 104 in normal operational (i.e., non-BIST) mode or the above-referred current address input 92 in BIST mode. The inputs to write data logic 94 and address and enable logic 98 that receive the mode selection are not shown for purposes of clarity. It can be noted that address and enable logic 98 also includes, in addition to logic for performing this address input multiplexing function, complex address pre-coding logic. This complex address pre-coding logic contributes to the combinational logic delays that first pipeline register 60 (FIG. 2) helps alleviate.

When BIST mode is not selected, i.e., when memory system 44 (FIG. 2) is in normal operational mode, memory system 44 operates as follows. In response to an external system, such as a processor system, initiating a write operation, memory subsystem 46 writes the data that the external system presents at normal data input 102 to a memory location corresponding to an address that the external system presents at normal address input 104. Before each data word is written to memory array 91, the data word is temporarily stored or registered in write data register 96. The address in memory array 91 to which the data word is to be written, which can be referred to as the "last address," is temporarily stored or registered in address and enable register 100. Address and enable register 100 provides not only the last address but also the memory control signals (e.g., one or more write enable signals) to memory array 91. In response to these address and control signals, memory array 91 stores the data word.

In response to the external system initiating a read operation, memory subsystem 46 reads data from a memory location corresponding to an address that the external system presents at normal address input 104. Address and enable register 100 holds the ("last") address from which the data word is to be read as well as the memory control signals (e.g., one or more read enable signals) to memory array 91. Each data word as it is read from memory array 91 is temporarily stored or registered in data output register 93. In normal operational mode, the contents of data output register 93 are presented at a data output 106 of memory subsystem 46.

When BIST mode is selected, memory system 44 operates as follows. Sequential control logic 74 is configured in accordance with an algorithm that, as described in further detail below, first causes test data to be written to a sequence of memory locations in memory array 91, and then causes those memory locations to be read back in generally the same sequence. As each memory location is read back, the value read from that memory location is compared with expected data 82. If the data that is read back does not match expected data 82, an error or failure condition is flagged.

Although the state machine 75 defines a number of states, in the exemplary embodiment one such state is a state in which the BIST circuitry writes test data 84 to sequentially increasing addresses. Address counter logic 54 essentially comprises an adder or similar arithmetic circuitry that, when this state occurs, adds one to (i.e., increments) current address 90 to produce a next address 108. Other states may occur in which address counter logic 54 adds a number other than one to current address 90 or subtracts a number from current address 90 to produce next address 108. On each clock cycle until the maximum address is reached, pipeline register 62 causes next address 108 to become current address 90. The successive addresses that address counter logic 54 produces on successive clock cycles in this state define an address sequence.

Address comparison logic 56 compares current address 90 with a maximum address ("MAX_ADDR") that represents the ending address of the sequence of addresses or memory locations in memory array 91 (FIG. 3) to be tested. Memory locations spanning addresses from a base address, such as zero, to the maximum address are tested. If current address 90 matches the maximum address, address comparison logic 56 provides maximum address signal 78 ("AT_MAX") to pipeline register 64, which temporarily (i.e., for one clock cycle) stores or registers maximum address signal 78. Pipeline register 64 thus provides a delayed maximum address signal, which defines another state information signal 110, to next state decoding logic 72 of sequential control logic 48. This assertion of maximum address signal 78 also causes multiplexer 71 to select the maximum address for pipeline register 62 to cause to become current address 90.

In the above-referenced state in which the BIST circuitry writes test data 84 to sequentially increasing addresses in memory array 91 (i.e., addresses in an address sequence), memory control signal decoding logic 52 produces a set of memory control signals 86 that enable memory subsystem 46 to perform a write operation on each clock cycle. The successive sets of such memory control signals 86 that are produced on successive clock cycles in this state define a memory control signal set sequence. In this state, the memory control signal set sequence corresponds to the address sequence indicating the memory locations in memory array 91 to which test data 84 is to be written. That is, for each address that address counter logic 54 produces in the address sequence, memory control signals decoding logic 52 produces a corresponding memory control signal set in the memory control signal set sequence that enables test data 84 to be written to that address.

Before each test data value (word) is written to memory array 91, the test data value is temporarily stored or registered in write data register 96. The address in memory array 91 to which the test data value is to be written (i.e., the "last address") is temporarily stored or registered in decoded format in address and enable register 100. Address and enable register 100 provides this "last address" and corresponding memory control signals (e.g., one or more write enable signals) to memory array 91. In response to these address and control signals, memory array 91 stores the test data value.

In an instance in which sequential control logic 48 determines from the state information signal 110 that the write operations have reached the maximum address, state machine 75 can cause the write operations to stop by generating state information signals 80, 110 and 114 (described below) in which a stop or "hold" condition is encoded. Memory control signal decoding logic 52 decodes such state information signals 80, 110 and 114 in a manner that adjusts memory control signals 86 to inhibit memory subsystem 46 from performing a next write operation. Thus, when the BIST circuitry is writing test data to memory array 91, the addresses to which the test data values are written are generally incremented by one on each successive clock cycle until the maximum address is reached.

After the BIST circuitry writes test data 84 to all addresses in memory array 91 spanning the base address through the maximum address, the BIST circuitry begins reading data out of those same addresses. Accordingly, another state defined by the combination 75 of state flip-flops 74 in sequential control logic 48 and pipeline registers 64 and 66 is a state in which current address 90 is reset to the base address in preparation for beginning the sequence of read operations. During the sequence of read operations, address counter logic 54 and address comparison logic 56 operate in essentially the same manner described above with regard to the sequence of write operations. That is, the addresses from which data values are read are generally incremented by one on each successive clock cycle until the maximum address is reached. When the maximum address is reached, state machine 75 can cause the read operations to stop by generating state information signals 80, 110 and 114 in which a stop or hold condition is encoded. Memory control signal decoding logic 52 decodes such state information signals 80, 110 and 114 in a manner that adjusts memory control signals 86 to inhibit memory subsystem 46 from performing a next read operation.

A stop or hold condition during the sequence of read operations can be triggered not only by reaching the maximum address but also by a failure. Data comparison logic 58 receives expected data 82 from write data decoding logic 50 and compares the output data 112 read from memory subsystem 46 to expected data 82. That is, data comparison logic 58 compares each data value read back from memory array 91 (stored in data output register 93) to a corresponding expected data value. If the data value that is read back matches the expected data value, data comparison logic 58 sets the value of pass-fail signal 76 to indicate that the test of that memory location passed. If the data value that is read back does not match the expected data value, data comparison logic 58 sets the value of pass-fail signal 76 to indicate that the test of that memory location failed. Although not shown for purposes of clarity, memory system 44 includes additional circuitry that outputs diagnostic information identifying addresses at which the test failed to an external system (e.g., not on the same IC chip as memory system 44).

Data comparison logic 58 provides pass-fail signal 76 to pipeline register 66, which temporarily (i.e., for one clock cycle) stores or registers pass-fail signal 76. Pipeline register 66 thus provides a delayed pass-fail signal, which defines another state information signal 114, to next state decoding logic 72 of sequential control logic 48. In an instance in which state machine 75 determines from state information signal 114 that a failure has occurred in the testing of a memory location, state machine 75 can cause the read operations to stop by generating state information signals 80, 110 and 114 in which a stop or "hold" condition is encoded. Memory control signal decoding logic 52 decodes such state information signals 80 in a manner that adjusts memory control signals 86 to inhibit memory subsystem 46 from performing a next read operation. Thus, when the BIST circuitry is reading data back from memory array 91, the addresses from which the data values are read are generally incremented by one on each successive clock cycle until either the maximum address is reached or a failure occurs.

Features are included in memory system 44 to compensate for the one clock cycle delay inherent in each of pipeline registers 60-66. In the exemplary embodiment the delay inherent in each of pipeline registers 60-66 is compensated for as follows.

The delay inherent in first pipeline register 60 is compensated for in part by memory control signal decoding logic 52 outputting a set of memory control signals 86 one memory control signal set in the memory control signal set sequence ahead of the current memory control signal set corresponding to the current memory address. This delay is also compensated in part by AND gate 70 gating memory control signals 86 (i.e., each memory control signal set) with the maximum address signal 78 ("AT_MAX") so as to inhibit the enable signals that are loaded into first pipeline register 60 (and thereby disable write and read operations) when the maximum address is reached. These compensation features are further illustrated by the timing diagrams of FIGS. 4 and 5, described below.

The delay inherent in second pipeline register 62 is compensated for by address counter logic 54 being one address in the address sequence ahead of the current address when sequential control logic 48 is in a state in which test data 84 is being written to memory subsystem 46. This compensation feature is further illustrated by the timing diagrams of FIGS. 4 and 5, described below.

The delay inherent in third pipeline register 64 is compensated for in part by stopping address counter logic 54 from changing (e.g., incrementing) current address 90 before the next clock cycle. That is, during the same clock cycle in which state machine 75 outputs state information signals 80, 110 and 114 that indicate an increment condition ("INCR"), multiplexer 71 forces the maximum address ("MAX_ADDR") to the input of second pipeline register 62, which accordingly does not increment or otherwise change current address 90. This delay is also compensated in part by AND gate 70 gating memory control signals 86 (i.e., each memory control signal set) with the maximum address signal 78 ("AT_MAX") so as to inhibit the enable signals that are loaded into first pipeline register 60 (and thereby disable write and read operations) when the maximum address is reached. These compensation features are further illustrated by the timing diagrams of FIGS. 4 and 5, described below.

The delay inherent in fourth pipeline register 66 is compensated for by not stopping address counter logic 54 from changing next address 108 until after the next clock cycle. That is, during the same clock cycle in which state machine 75 outputs state information signals 80, 110 and 114 that indicate a hold condition, address counter logic 54 decodes those state information signals 80, 110 and 114 and accordingly continues to increment current address 90 for one additional clock cycle.

The above-described delay compensation features can further be described with reference to the timing diagrams of FIGS. 4 and 5. An exemplary sequence of actions that occur upon a data failure when the BIST circuitry is reading data back from memory subsystem 46 is illustrated in FIG. 4. An exemplary sequence of actions that occur upon reaching the maximum address when the BIST circuitry is reading data back from memory subsystem 46 is illustrated in FIG. 5. In each of FIGS. 4 and 5, the actions are shown as occurring in synchronization with an exemplary sequence of first through eighth clock cycles ("CLK_1" "CLK_2," "CLK_3," etc.).

In the example illustrated in FIG. 4, the BIST circuitry begins in a state (arbitrarily labeled "A") in which successive addresses (i.e., memory locations) are read from memory array 91. Address counter logic 54 decodes state information signals 80, 110 and 114 that state machine 75 produces in this ("A") state. This decoding of state information signals 80, 110 and 114 indicates to address counter logic 54 a ("COUNT") condition in which it is to increment ("INCR") its output (i.e., next address 108) by one on each successive clock cycle. As described above with regard to FIG. 2, current address 90 lags behind next address 108 by one clock cycle.

It should be appreciated that the memory control sequence set that is output by memory control signal decoding logic 52 in the illustrated example comprises a read enable signal that is destined for (or corresponds to) a read operation from a current address that is one clock cycle later. For example, during the first clock cycle ("CLK_1") in FIG. 4, memory control signal decoding logic 52 produces a read enable signal that is destined for effecting a read operation from the current address "MAX−1." Thus, stated conversely on each clock cycle memory control signal decoding logic 52 outputs such a read enable signal that is one read enable signal in the sequence ahead of the read enable signal corresponding to the current address. This read enable signal is stored or registered in first pipeline register 60. The address portion of the output of first pipeline register 60 is denoted as "RD ENABLE (REGistered)" in FIGS. 4 and 5.

Note that address counter logic 54 is one address in the address sequence ahead of current address 90. For example, during the first clock cycle shown in FIG. 4 ("CLK_1"), address counter logic 54 produces a next address 108 of MAX−1, yet the current address 90 that is dictated by the algorithm of sequential control logic 48 is MAX−2.

Current address 90 and the read enable signal or signals are stored or registered for one clock cycle in address and enable register 100. As noted above, the address portion of the output of address and enable register 100 is referred to as the "last address."

In response to the last address and the read enable signal or signals stored in address and enable register 100, memory array 91 produces output data ("MEMORY OUTPUT") representing a data value stored at that address. Each such output data value is denoted "TD(X)" in FIG. 4 to indicate that the output data value that is read out of memory array 91 from an address X is denoted "TD(X)" in reference to the test data (TD) value that was previously written to that address. Each such output data value is stored or registered for one clock cycle in output data register 92 (FIG. 3). Each expected data value is denoted "ED(X)" in FIG. 4 to indicate that it is an expected data (ED) value that corresponds to the test data value previously written to an address X.

As described above with regard to FIG. 2, data comparison logic 58 compares each TD(X) value with each corresponding ED(X) value. If data comparison logic 58 determines that TD(X) matches ED(X), then data comparison logic 58 sets pass-fail signal 76 to indicate a pass condition. In the example shown in FIG. 4, data comparison logic 58 determines that the first several data values read out of memory array 91 match their corresponding expected data values. However, in this example data comparison logic 58 determines during the fifth clock cycle ("CLK_5") that TD(N) does not match ED(N). (N is an index integer that is arbitrary for purposes of this example.) Accordingly data comparison logic 58 sets pass-fail signal 76 to indicate a fail condition in the fifth clock cycle of this example ("CLK_5"). As the delayed pass-fail indication (i.e., the value stored or registered in fourth pipeline register 66 is delayed by one clock cycle, sequential control logic 48 receives this indication of a fail condition one clock cycle later during the sixth clock cycle ("CLK_6") of this example.

State machine 75 produces state information signals 80, 110 and 114 that reflect the fail condition and, accordingly, a transition to another state ("B"). Address counter logic 54 decodes such state information signals 80 that sequential control logic 48 produces in this ("B") state. This decoding of state information signals 80 indicates to address counter logic 54 a ("COUNT") condition in which it is to hold ("HOLD") its output (i.e., next address 108) during the next clock cycle ("CLK_6"). That is, address counter logic 54 does not increment next address 108 during the sixth clock cycle ("CLK_6") of this example. Note that in the seventh clock cycle of this example ("CLK_7") memory control signal decoding logic 52 produces memory control signals 86 that prevent or disable a read operation (e.g., a read enable signal is "FALSE"). As such a next read operation is disabled, no such read operation occurs in the eighth clock cycle ("CLK_8"). Also note in this example that maximum address signal 78 ("AT_MAX")

and the delayed maximum address signal (i.e., the value stored or registered in third pipeline register 64) remain false, indicating that the maximum address has not been reached.

Current address 90 stops incrementing at an address N+3 as a result of the fail condition. Accordingly, the above-referenced circuitry (not shown) that outputs diagnostic information to an external system indicating addresses that failed the test can subtract 3 from current address 90 to identify the address (N) in memory array 91 at which the test failed. Note that address counter logic 54 does not stop incrementing next address 108 immediately after the clock cycle ("CLK_5") in which the fail condition occurred. Rather, address counter logic 54 does not stop incrementing next address 108 until after that clock cycle, and accordingly, current address 90 does not stop incrementing until after the next clock cycle ("CLK_6"), which is clock cycle CLK_7. Not stopping address counter logic 54 from causing current address 90 to increment (or stated conversely, allowing counter logic 54 to continue to cause current address 90 to increment) until after the next clock cycle following the fail condition compensates for the presence fourth pipeline register 66. A consequence of this compensation feature is that a value of 3 must be subtracted from current address 90 to identify the address (N) in memory array 91 at which the test failed.

The example illustrated in FIG. 5 is similar to the example described above with regard to FIG. 4 in that the BIST circuitry begins in the state ("A") in which successive addresses (i.e., memory locations) are read from memory array 91. For brevity, aspects of the example illustrated in FIG. 5 that are similar to those described above with regard to FIG. 4 will not be described in similar detail. In this example, note that current address 90 reaches the maximum address (abbreviated "MAX" in FIG. 5) during the third clock cycle ("CLK_3"), and address comparison logic 56 accordingly produces the maximum address indication 78. As the delayed maximum address indication (i.e., the value stored or registered in third pipeline register 64) is delayed by one clock cycle, sequential control logic 48 receives this delayed maximum address indication one clock cycle later during the fourth clock cycle ("CLK_4") of this example.

The presence of third pipeline register 64 between the output of address comparison logic 56 and address counter logic 54 is compensated for by immediately (i.e., in the same clock cycle ("CLK_3") in which current address 90 reaches the maximum address) stopping address counter logic 54 from causing current address 90 to increment. Address counter logic 54 is unable to cause current address 90 to increment because multiplexer 71 responds to the assertion of maximum address indication 78 by selecting the maximum address ("MAX_ADDR") as its input instead of next address 108. As a result of this selection, current address 90 is forced to remain at the maximum address.

State machine 75 produces state information signals 80, 110 and 114 that reflect the above-described maximum address condition and, accordingly, a transition to another state ("C"). Address counter logic 54 decodes such state information signals 80 that sequential control logic 48 produces in this ("C") state. As in above-described FIG. 4, state information signal 110 (FIG. 2) is denoted "AT_MAX (DELAYED)" in FIG. 5, and each data value that is read out of memory array 91 from an address X is denoted "TD(X)" in reference to the test data (TD) value that was previously written to that address.

This decoding of state information signals 80, 110 and 114 indicates to address counter logic 54 a ("COUNT") condition in which it is to hold ("HOLD") its output (i.e., next address 108) during the next clock cycle ("CLK_5"). That is, address counter logic 54 does not increment next address 108 during the fifth clock cycle ("CLK_5") of this example. These conditions also define yet another state ("D") to which sequential control logic 48 transitions during the fifth clock cycle ("CLK_5").

Note that in the sixth clock cycle of this example ("CLK_6") sequential control logic 48 transitions to still another state ("E"). The decoding by address counter logic 54 of state information signals 80 that sequential control logic 48 produces in this ("E") state indicates to address counter logic 54 a ("COUNT") condition in which it is to reset ("RESET") its output (i.e., next address 108). That is, address counter logic 54 resets or changes next address 108 during the sixth clock cycle ("CLK_6") from the maximum address to the base address (e.g., an address of zero).

Also note that in the fourth clock cycle ("CLK_4") of the example illustrated in FIG. 5 memory control signal decoding logic 52 produces memory control signals 86 that prevent or disable a read operation (e.g., a read enable signal is "FALSE"). As such a next read operation is disabled, no such read operation occurs in the fifth clock cycle ("CLK_5") of this example. Likewise, in the fifth clock cycle ("CLK_5") of the example memory control signal decoding logic 52 produces memory control signals 86 that prevent or disable a read operation (e.g., a read enable signal is "FALSE"). As such a next read operation is disabled, no such read operation occurs in the sixth clock cycle ("CLK_6") of this example.

One or more illustrative or exemplary embodiments of the invention have been described above. However, it is to be understood that the invention is defined by the appended claims and is not limited to the specific embodiments described.

What is claimed is:

1. An integrated memory built-in self-test system, comprising:
    a memory subsystem comprising a memory array and configured to read data from and write data to addresses in the memory array;
    sequential control logic configured to control testing a plurality of addresses in the memory array by performing write operations of test data to a sequence of addresses in an address sequence and read operations of output data from the sequence of addresses in the address sequence, the sequential control logic having a plurality of states and outputting state information corresponding to a current state of the plurality of states;
    write data decoding logic configured to receive at least a portion of the state information from the sequential control logic and generate test data values and expected data values;
    memory control signal decoding logic configured to receive at least a portion of the state information from the sequential control logic and generate a current memory control signal set in a memory control signal set sequence, the current memory control signal set corresponding to a current address in the address sequence;
    address counter logic configured to receive at least a portion of the state information from the sequential control logic and generate addresses in the address sequence, the memory subsystem testing memory locations in response to addresses generated by the address counter logic and memory control signals generated by the memory control signal decoding logic;
    address comparison logic configured to receive the current address and compare the current address with a maximum address and to output a maximum address indication when the current address reaches the maximum address;

data comparison logic configured to receive data read from a tested memory location in response to a memory address generated by the address counter logic, the data comparison logic further configured to compare the data read from a tested memory location with an expected data value to determine whether the tested memory location functions to accurately store the test data and to output a pass-fail indication of whether the tested memory location functions to accurately store the test data; and at least one pipeline register disposed between a pair of elements selected from: the memory control signal decoding logic and the memory subsystem; the address counter logic and the address comparison logic; the address comparison logic and the sequential control logic; the address comparison logic and the address counter logic; the address comparison logic and the memory control signal decoding logic; the data comparison logic and the sequential control logic; the data comparison logic and the address counter logic; and the data comparison logic and the memory control signal decoding logic.

2. The integrated memory built-in self-test system of claim 1, wherein the at least one pipeline register comprises a first pipeline register disposed between the memory control signal decoding logic and the memory subsystem, a second pipeline register disposed between the address counter logic and the address comparison logic, a third pipeline register disposed between the address comparison logic and the address counter logic, and a fourth pipeline register disposed between the data comparison logic and the address counter logic.

3. The integrated memory built-in self-test system of claim 1, wherein a pipeline register disposed between the memory control signal decoding logic and the memory subsystem introduces a delay of one clock cycle between the memory control signal decoding logic outputting the memory control signal set and the memory subsystem inputting the memory control signal set, which delay of one clock cycle is compensated for by the memory control signal set outputted by the memory control signal decoding logic being one memory control signal set in the memory control signal set sequence ahead of the current memory control signal set corresponding to the current memory address.

4. The integrated memory built-in self test system of claim 3, wherein the delay of one clock cycle is further compensated for by gating the memory control signal set output by the memory control signal decoding logic with the maximum address indication to produce gated memory control signals, and providing the gated memory control signals to the memory subsystem.

5. The integrated memory built-in self-test system of claim 1, wherein a pipeline register disposed between the address counter logic and the address comparison logic outputs the current address to the address input of the memory subsystem and introduces a delay of one clock cycle between the address counter logic outputting an address and the address comparison logic inputting the address, which delay of one clock cycle is compensated for by the address counter logic being one address in the address sequence ahead of the current address.

6. The integrated memory built-in self-test system of claim 1, wherein a pipeline register disposed between the address comparison logic and the address counter logic introduces a delay of one clock cycle between the address comparison logic outputting the maximum address indication and the address counter logic inputting the maximum address indication, which delay of one clock cycle is compensated for by stopping the address counter logic from changing the current address before a next clock cycle.

7. The integrated memory built-in self-test system of claim 1, wherein a pipeline register disposed between the address comparison logic and the memory control signal decoding logic introduces a delay of one clock cycle between the address comparison logic outputting the maximum address indication and the memory control signal decoding logic inputting the maximum address indication, which delay of one clock cycle is compensated for by gating the memory control signal set output by the memory control signal decoding logic with the maximum address indication to produce gated memory control signals, and providing the gated memory control signals to the memory subsystem.

8. The integrated memory built-in self-test system of claim 1, wherein a pipeline register disposed between the data comparison logic and the address counter logic introduces a delay of one clock cycle between the data comparison logic outputting the pass-fail indication and the sequential control logic inputting the pass-fail indication, which delay of one clock cycle is compensated for by not stopping the address counter logic from changing the current address until after a next clock cycle.

9. A method of operation of a memory system under self test, the memory system comprising a memory subsystem having a memory array, sequential control logic, write data decoding logic, memory control signal decoding logic, address counter logic, address comparison logic, and data comparison logic, the method comprising:

the sequential control logic controlling reading test data from and writing data to addresses in the memory array in accordance with an address sequence controlled by the sequential control logic, the sequential control logic having a plurality of states and outputting state information corresponding to a current state of the plurality of states;

the write data decoding logic receiving at least a portion of the state information from the sequential control logic and generating test data values and expected data values;

the memory control signal decoding logic receiving at least a portion of the state information from the sequential control logic and generating a current memory control signal set in a memory control signal set sequence, the current memory control signal set corresponding to a current address in the address sequence;

the address counter logic receiving at least a portion of the state information from the sequential control logic and generating addresses in the address sequence, the memory subsystem testing memory locations in response to addresses generated by the address counter logic and memory control signals generated by the memory control signal decoding logic;

the address comparison logic receiving the current address and comparing the current address with a maximum address and outputting a maximum address indication when the current address reaches the maximum address;

the data comparison logic receiving data read from a tested memory location in response to a memory address generated by the address counter logic, the data comparison logic further comparing the data read from a tested memory location with an expected data value to determine whether the tested memory location functions to accurately store the test data, the data comparison logic outputting a pass-fail indication of whether the tested memory location functions to accurately store the test data; and registering information transferred between a pair of elements to delay a transfer of the information between the pair of elements by one clock cycle, the pair of elements selected from: the memory control signal decoding logic and the memory subsystem; the address counter logic and the address comparison logic; the address comparison logic and the sequential control logic; the address comparison logic and the address counter logic; the address comparison logic and the memory control signal decoding logic; the data comparison logic and the sequential control logic; the data comparison logic and the address counter logic; and the data comparison logic and the memory control signal decoding logic.

10. The method of claim 9, wherein registering information transferred between a pair of elements comprises:

providing a delay of one clock cycle between output of the information from the memory control signal decoding logic and input of the information to the memory subsystem;

providing a delay of one clock cycle between output of the information from the address counter logic and input of the information to the address comparison logic;

providing a delay of one clock cycle between output of the information from the address comparison logic and input of the information to the address counter logic;

providing a delay of one clock cycle between output of the information from the data comparison logic and input of the information to the address counter logic.

11. The method of claim 9, wherein registering information transferred between the memory control signal decoding logic and the memory subsystem introduces a delay of one clock cycle between the memory control signal decoding logic outputting the memory control signal set and the memory subsystem inputting the memory control signal set, which delay of one clock cycle is compensated for by the memory control signal set outputted by the memory control signal decoding logic being one memory control signal set in the memory control signal set sequence ahead of the current memory control signal set corresponding to the current memory address.

12. The method of claim 11, wherein the delay of one clock cycle is further compensated for by gating the memory control signal set output by the memory control signal decoding logic with the maximum address indication to produce gated memory control signals, and providing the gated memory control signals to the memory subsystem.

13. The method of claim 9, wherein registering information transferred between the address counter logic and the address comparison logic introduces a delay of one clock cycle between the address counter logic outputting an address and the address comparison logic inputting the address, which delay of one clock cycle is compensated for by the address counter logic being one address in the address sequence ahead of the current address.

14. The method of claim 9, wherein registering information transferred between the address comparison logic and the address counter logic introduces a delay of one clock cycle between the address comparison logic outputting the maximum address indication and the address counter logic inputting the maximum address indication, which delay of one clock cycle is compensated for by stopping the address counter logic from changing the current address before a next clock cycle.

15. The method of claim 9, wherein registering information transferred between the address comparison logic and the memory control signal decoding logic introduces a delay of one clock cycle between the address comparison logic outputting the maximum address indication and the memory control signal decoding logic inputting the maximum address indication, which delay of one clock cycle is compensated for by gating the memory control signal set output by the memory control signal decoding logic with the maximum address indication to produce gated memory control signals, and providing the gated memory control signals to the memory subsystem.

16. The method of claim 9, wherein registering information transferred between the data comparison logic and the address counter logic introduces a delay of one clock cycle between the data comparison logic outputting the pass-fail indication and the sequential control logic inputting the pass-fail indication, which delay of one clock cycle is compensated for by not stopping the address counter logic from changing the current address until after a next clock cycle.

* * * * *